(12) United States Patent
Zhao et al.

(10) Patent No.: US 11,088,225 B2
(45) Date of Patent: Aug. 10, 2021

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Yong Zhao, Wuhan (CN); Zuomin Liao, Wuhan (CN); Tao Chen, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 62 days.

(21) Appl. No.: 16/637,817

(22) PCT Filed: Nov. 6, 2019

(86) PCT No.: PCT/CN2019/116101
§ 371 (c)(1),
(2) Date: Feb. 10, 2020

(87) PCT Pub. No.: WO2021/027106
PCT Pub. Date: Feb. 18, 2021

(65) Prior Publication Data
US 2021/0043702 A1    Feb. 11, 2021

Related U.S. Application Data

(66) Substitute for application No. PCT/CN2019/116101, filed on Nov. 6, 2019.

(30) Foreign Application Priority Data

Aug. 9, 2019   (CN) .......................... 201910735413.7

(51) Int. Cl.
*H01L 27/32*        (2006.01)
*H01L 51/52*        (2006.01)

(52) U.S. Cl.
CPC ...... *H01L 27/3234* (2013.01); *H01L 27/3244* (2013.01); *H01L 51/5209* (2013.01)

(58) Field of Classification Search
CPC ............. H01L 27/3234; H01L 27/3244; H01L 51/5209
See application file for complete search history.

(56) References Cited

U.S. PATENT DOCUMENTS

2020/0111930 A1*  4/2020  Ting ...................... H01L 31/12

* cited by examiner

*Primary Examiner* — Daniel P Shook

(57) ABSTRACT

The present invention provides a display device including a display panel. The display panel includes a main display region and a function additional region, and at least a portion of the function additional region is surrounded by the main display region. A plurality of first pixels are arranged in the function additional region. At least one light transmitting region is disposed in the function additional region, and an area of each of the at least one light transmitting region is greater than or equal to 0.32 mm².

20 Claims, 16 Drawing Sheets

DISPLAY DEVICE

FIELD OF INVENTION

The present invention relates to the field of display technologies, and in particular, to a display device.

BACKGROUND OF INVENTION

In the design of OLED display panels using under-screen cameras, in order to increase a transmittance at a camera area on the display panel, laser processes are used to dig the camera area.

In the design of OLED display panels, how to have both camera and display functions in the camera area has always been a problem. At present, as the display function is arranged in the camera area, the transmittance of the camera area is greatly reduced, which causes a large impact on the camera function of the camera area and affects user experience.

Technical Problem

Current OLED display panels using under-screen cameras have a technical problem that: a camera area does not display images, and an effect of full-screen display cannot be presented, which affects user experience.

Technical Solution

A display device, comprises a display panel. The display panel comprises a main display region and a function additional region, and at least a portion of the function additional region is surrounding by the main display region;

wherein a plurality of first pixels are arranged in the function additional region, at least one light transmitting region is disposed in the function additional region, and an area of each of the light transmitting regions is greater than or equal to 0.32 square millimeters (mm2); and wherein an overall shape of the light transmitting region is circular, large semicircular or small semicircular, and a length of a diameter of the light transmitting region is 1.0 to 10 mm; or the overall shape of the light transmitting region is a regular polygon, a short side of the light transmitting region has a length of 1.0 to 10 mm, and a long side of the light transmitting region has a length of 1.5 to 200 mm.

Further, the area of each of the light transmitting region is less than or equal to 120 mm$^2$.

Further, the area of each of the light transmitting region is 0.36 to 100 mm$^2$.

Further, a first anode for driving the first pixel is provided in at least one of the light transmitting region, a sum of the areas of all of the first anodes disposed in the light transmitting region is less than or equal to 50% of the area of the corresponding light transmitting region.

Further, the sum of the areas of all of the first anodes disposed in the light transmitting region is greater than or equal to 5% of the area of the corresponding light transmitting region.

Further, the display device further comprises a substrate and a plurality of first driving circuits disposed on the substrate, and the first driving circuits disposed at a periphery of the light transmitting region.

Further, the display panel further comprises at least two insulating layers disposed on the substrate, the first driving circuit is disposed on the substrate and covers by the insulating layers, and the first driving circuit and the first anode is electrically connected through a transparent wire disposed in at least two of the insulating layers.

Further, a plurality of second pixels are disposed in the main display region, a second driving circuit disposed in the main display region is disposed on the substrate, and the second pixels are electrically connected to the second driving circuit through a conductive layer disposed in at least two layers of the insulating layer.

Further, the area of each of the light transmitting region is greater than or equal to 50 times an area of each of the second pixels, and the area of each of the light transmitting region is less than or equal to 210,000 times the area of each of the second pixels.

A display device, comprises a display panel. The display panel comprises a main display region and a function additional region, and at least a portion of the function additional region is surrounding by the main display region;

wherein a plurality of first pixels are arranged in the function additional region, at least one light transmitting region is disposed in the function additional region, and an area of each of the light transmitting regions is greater than or equal to 0.32 square millimeters (mm2).

Further, the area of each of the light transmitting region is less than or equal to 120 mm$^2$.

Further, the area of each of the light transmitting region is 0.36 to 100 mm$^2$.

Further, a first anode for driving the first pixel is provided in at least one of the light transmitting region, a sum of the areas of all of the first anodes disposed in the light transmitting region is less than or equal to 50% of the area of the corresponding light transmitting region.

Further, the sum of the areas of all of the first anodes disposed in the light transmitting region is greater than or equal to 5% of the area of the corresponding light transmitting region.

Further, the display device further comprises a substrate and a plurality of first driving circuits disposed on the substrate, and the first driving circuits disposed at a periphery of the light transmitting region.

Further, the display panel further comprises at least two insulating layers disposed on the substrate, the first driving circuit is disposed on the substrate and covers by the insulating layers, and the first driving circuit and the first anode is electrically connected through a transparent wire disposed in at least two of the insulating layers.

Further, a plurality of second pixels are disposed in the main display region, a second driving circuit disposed in the main display region is disposed on the substrate, and the second pixels are electrically connected to the second driving circuit through a conductive layer disposed in at least two layers of the insulating layer.

Further, the area of each of the light transmitting region is greater than or equal to 50 times an area of each of the second pixels, and the area of each of the light transmitting region is less than or equal to 210,000 times the area of each of the second pixels.

Further, an overall shape of the light transmitting region is circular, large semicircular or small semicircular, and a length of a diameter of the light transmitting region is 1.0 to 10 mm.

Further, an overall shape of the light transmitting region is a regular polygon, a short side of the light transmitting region has a length of 1.0 to 10 mm, and a long side of the light transmitting region has a length of 1.5 to 200 mm.

Beneficial Effect

By properly setting shapes and areas of a light transmitting region, and limiting an area of a first anode disposed in the light transmitting region, an overall transmittance of the function additional region is improved. A function additional region can be used for displaying images, so that a display panel can display an effect of a full-screen display, and can also be used for installing photosensitive elements such as a camera to improve user experience.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

REFERENCE NUMERALS

10: display panel; 11: main display region; 111: second pixel; 1111: second anode; 1112: second driving circuit; 12: function additional region; 121: light transmitting region; 122: first pixel; 1221: first driving circuit; 1222: first anode; 21: first sector region; 22: second sector region; 30: pixel driving circuit island; 41: first signal line; 411: first straight line section; 412: first transition section; 413: first bypass section; 42: second signal line; 421: second straight line section; 422: second transition section; 423: second bypass section; 50: substrate; 61: first insulating layer; 62: second insulating layer; 63: third insulating layer; 64: fourth insulating layer; 71: first overlapping line; 72: second overlapping line; 73: third overlapping line; 80: pixel definition layer; 81: pixel opening; 90: connecting line.

DETAILED DESCRIPTION OF PREFERRED EMBODIMENTS

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

The present invention is directed to a technical problem of a current OLED display panel, which is: in the current OLED display panel using an under-screen camera, a camera area does not display images, and an effect of full-screen display cannot be presented, which affects user experience.

Figure 1:
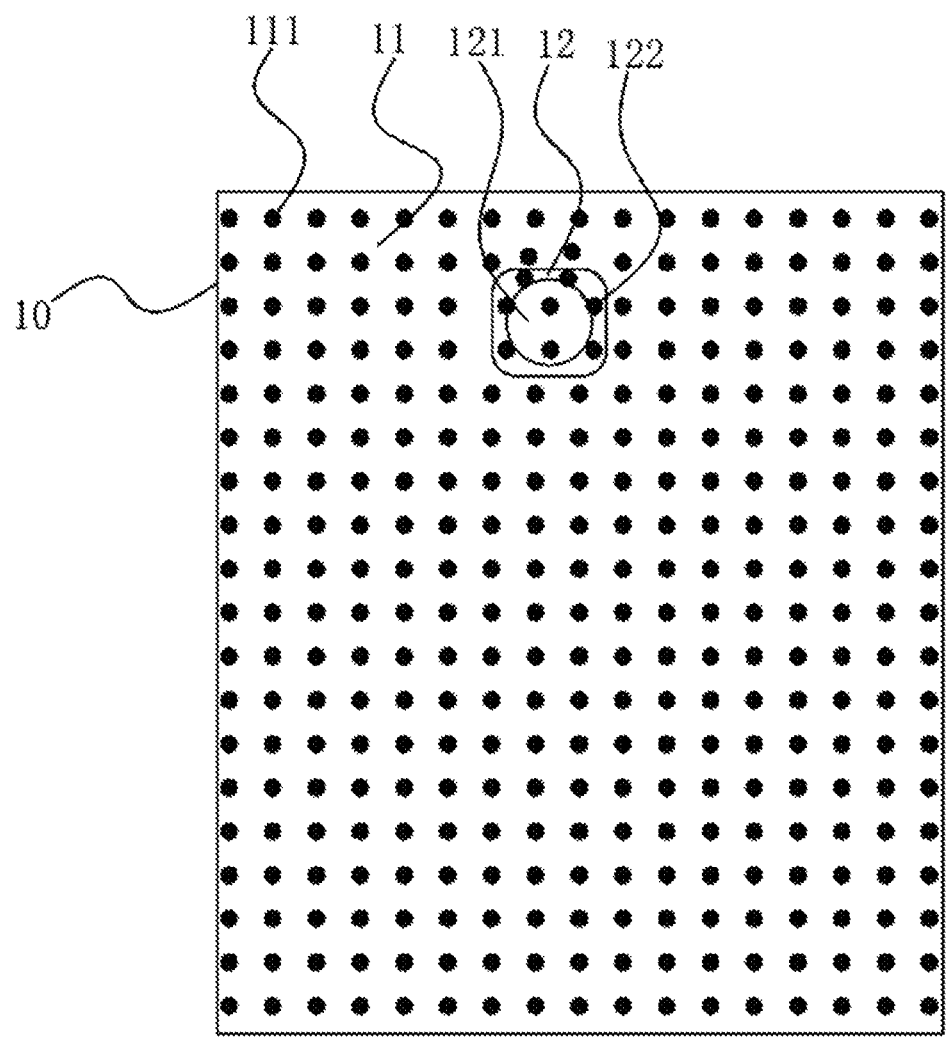
FIG. 1 is a schematic view of a display panel according to an embodiment of the present invention.

A display device, as shown in FIG. 1, the display device comprises a display panel 10. The display panel 10 comprises a main display region 11 and a function additional region 12, and at least a portion of the function additional region 12 is surrounding by the main display region 11.

The display panel 10 can be a full-screen display panel 10, a plurality of first pixels 122 are arranged in the function additional region 12, and a plurality of second pixels 111 are arranged in the main display region 11. The main display region 11 can display images, and the function additional region 12 can be disposed at any position of the display panel 10.

The function additional region 12 can be used for displaying the images, so that the display panel 10 can exhibit the effect of a full-screen display, and the function additional region 12 can also be used for mounting photosensitive elements such as a camera, an optical touch component, and a fingerprint recognition sensor, thereby improving the user experience.

It should be noted that a pixel density in the function additional region 12 may be the same as or different from a pixel density in the main display region 11. Display brightness at the function additional region 12 may be the same as or different from display brightness at the main display region 11.

In an embodiment, each first pixels 122 comprises a first red sub-pixel, a first blue sub-pixel, and a first green sub-pixel; and each second pixels 111 comprises a second red sub-pixel, a second blue sub-pixel, and a second green sub-pixel.

The function additional region 12 is provided with at least one light transmitting region 121, and the plurality of first pixels 122 are arranged in the light transmitting region 121.

By providing the at least one light transmitting region 121 in the function additional region 12, the light transmitting region 121 is used to increase an overall transmittance of the function additional region 12, thereby ensuring the overall transmittance of the function additional region 12 and realizing good display and camera functions in the function additional region 12 to enhance the user experience.

Figure 2:
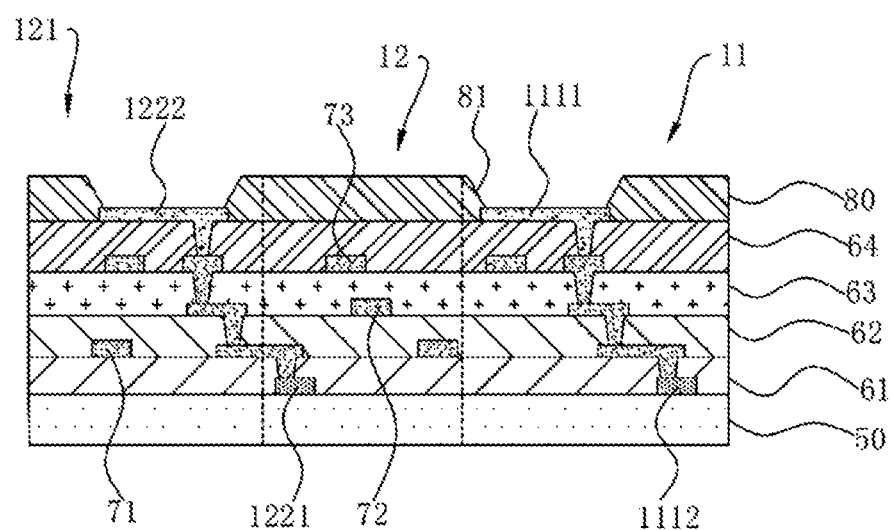
FIG. 2 is a schematic structural view of the display panel according to an embodiment of the present invention.

As shown in FIG. 2, the display panel 10 comprises a substrate 50, a plurality of first driving circuits 1221 disposed on the substrate 50 and disposed at a periphery of the light transmitting region 121, and at least two insulating layers disposed on the substrate 50. The first driving circuits 1221 are covered by the insulating layers. The first driving circuits 1221 and the first anode 1222 are electrically connected by a transparent wire disposed in the at least two insulating layers.

Further, the transparent wire comprises at least two connecting wires at different layers.

Further, the substrate 50 is provided with a second driving circuit 1112 disposed in the main display region 11. The second pixel 111 is electrically connected to the second driving circuit 1112 through a conductive layer disposed in at least two layers of the insulating layer.

In an embodiment, the display panel 10 comprises the first driving circuit 1221 disposed on the substrate 50, a first insulating layer 61 covering the first driving circuit 1221, a first overlapping line 71 disposed on the first insulating layer 61, a second insulating layer 62 covering the first overlapping line 71, a second overlapping line 72 disposed on the second insulating layer 62, a third insulating layer 63 covering the second overlapping line 72, a third overlapping line 73 disposed on the third insulating layer 63, a fourth insulating layer 64 covering the second overlapping line 72, and a pixel anode and a pixel definition layer 80 disposed on the fourth insulating layer 64. The pixel definition layer 80 has a pixel opening 81 corresponding to the pixel anode.

The overlapping line disposed in the light transmitting region 121 is a transparent wire. The overlapping lines disposed at different layers are electrically connected through vias. The electrical connection between the first anode 1222 and the first driving circuit 1221 is realized by electrical connection of the overlapping lines disposed in different layers, thereby facilitating wiring arrangement.

Specifically, spacings between two adjacent overlapping lines on the same layer is greater than 2 micrometers to prevent short circuit between two adjacent overlapping lines on the same layer. Line width of each overlapping line is greater than 1 micron.

Wherein, the pixel anode comprises the first anode 1222 and a second anode 1111 for driving the second pixel 111. The second anode 1111 is disposed in the main display region 11. A conductive layer may be the same as a structure and a process of the transparent wire, and the second anode 1111 is electrically connected to the second driving circuit 1112 through a plurality of overlapping lines.

It should be noted that, in actual implementation, the conductive layer may also be formed by multiple layers of opaque conductive lines disposed in the main display region 11. That is, the overlapping lines disposed in the main display region 11 are opaque conductive lines.

It should be noted that FIG. 2 only shows the case that the first anode 1222 is electrically connected to the first driving circuit 1221 through the overlapping lines disposed in the light transmitting region 121. In an actual implementation, the first anode 1222 can also be electrically connected to the first driving circuit 1221 through overlapping lines disposed at other regions in the function additional region 12 or overlapping lines in the main display region 11.

It should be noted that FIG. 2 only shows the case of having three overlapping lines. In actual implementation, it can also be set to two, four, five, or more layers of overlapping lines.

It should be noted that manufacturing materials of the transparent wire include, but are not limited to, indium tin metal oxide, indium zinc metal oxide, fluorine tin metal oxide, or nano silver wire. The insulating layer is made of a transparent material including, but not limited to, silicon oxide or silicon nitride.

Figure 3:
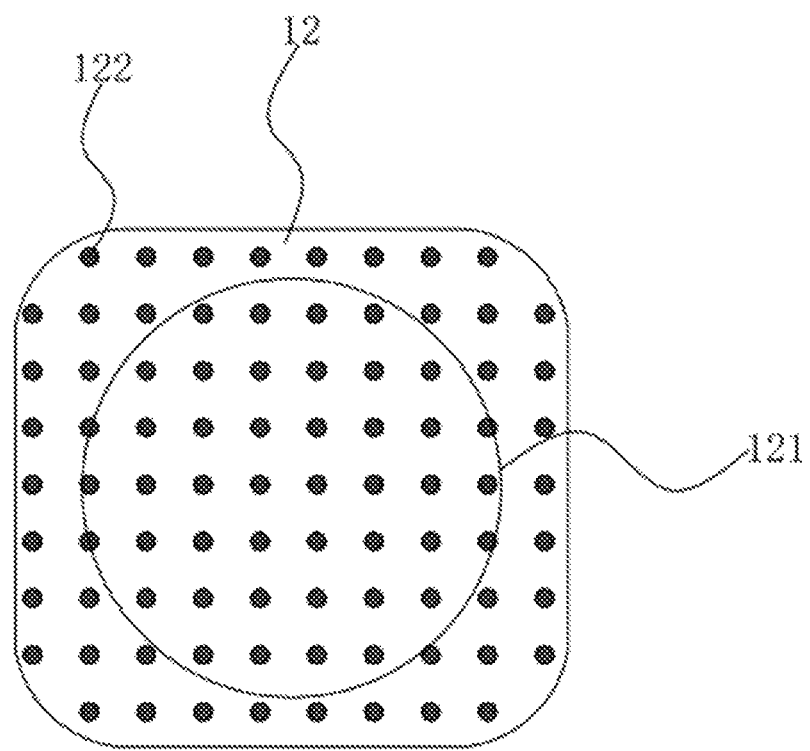
FIG. 3 is a schematic view showing an overall shape of a light transmitting region in a circular shape according to an embodiment of the present invention.

Specifically, as shown in FIG. 3, an area of each of the light transmitting regions 121 is greater than or equal to 0.32 square millimeters.

It can be understood that an arrangement of the light transmitting regions 121 can increase the transmittance of the function additional region 12. The driving of the first pixels 122 requires a transparent wire electrically connected thereto. The larger the area of the light transmitting region 121 is, the smaller the interference and diffraction of the transparent wire for driving the first pixels 122 can be reduced to, thereby improving a usage effect of the photosensitive elements such as the camera.

As shown in FIG. 3, the area of each of the light transmitting regions 121 is less than or equal to 120 square millimeters.

Further, each of the light transmitting regions 121 has the area of 0.36 to 100 square millimeters.

It should be noted that, as a person skilled in the art knows that the larger the area of the light transmitting region 121 is, the more layers of the overlapping lines need to be set, the greater the difficulty in the process, and the higher the cost. Therefore, a reasonable setting of the area of the light transmitting region 121 can reduce the difficulty of the process while ensuring the display and the light transmitting function of the light transmitting region 121.

In an embodiment, the area of each of the light transmitting regions 121 may be 0.5 square millimeters, 2 square millimeters, 10 square millimeters, 20 square millimeters, 50 square millimeters, or 80 square millimeters, which are not enumerated here.

It should be noted that, when the light transmitting region 121 is disposed, the area of the light transmitting region 121 can be set as large as possible according to the actual area of the function additional region 12. For example, the area of the light transmitting region 121 may be 120 square millimeters. When two or more light transmitting regions 121 are provided, the area of the light transmitting region 121 can be set as large as possible according to the actual area of the function additional region 12. It can be understood that the greater the number of the light transmitting regions 121 is, the smaller the area of each light transmitting regions 121 is.

Specifically, the area of each of the light transmitting regions 121 is greater than or equal to 50 times an area of each of the second pixels 111.

Further, the area of each of the light transmitting regions 121 is less than or equal to 210,000 times the area of each of the second pixels 111.

Furthermore, the area of each of the light transmitting regions 121 is 70 to 200,000 times the area of each of the second pixels 111.

In an embodiment, the area of each of the light transmitting region 121 may be 100 times, 500 times, 1,000 times, 5,000 times, 10,000 times, or 50,000 times the area of each of the second pixels 111, which are not enumerated here.

A first anode 1222 for driving the first pixel 122 is disposed in at least one of the light transmitting regions 121.

Specifically, a sum of the areas of all the first anodes 1222 disposed in the light transmitting region 121 is less than or equal to 50% of the area of the corresponding light transmitting region 121.

Further, the sum of the areas of all the first anodes 1222 disposed in the light transmitting region 121 is greater than or equal to 5% of the area of the corresponding light transmitting regions 121.

Figure 8:
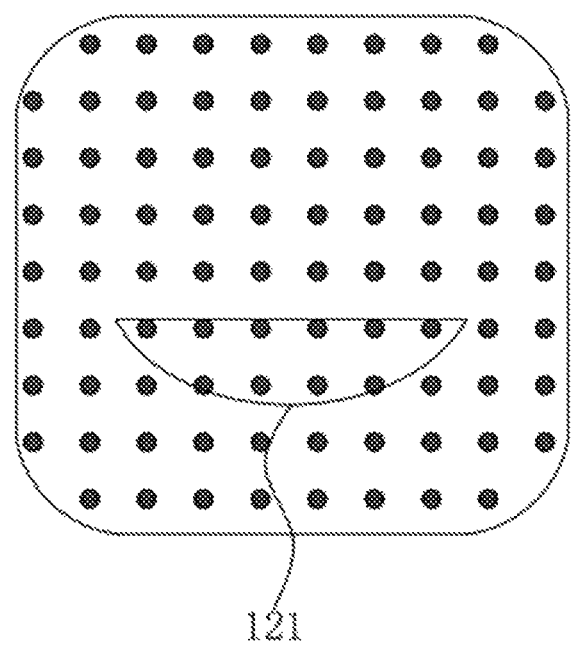
FIG. 8 is a schematic view showing the overall shape of the light transmitting region in a small semi-elliptical shape according to an embodiment of the present invention.

It should be noted that, as shown in FIG. 8, a portion of the first anode 1222 may be blocked by the pixel definition layer 80. In an embodiment, a sum of areas of portions of the first anode 1222 that are not blocked by the pixel definition layer 80 in the light transmitting region 121 is less than or equal to 50% of the area of the corresponding light transmitting region 121.

It should be noted that, as known by those skilled in the art, a manufacturing material of the first anode 1222 generally comprises an opaque material, such as a first transparent conductive film layer, a silver film layer, and a second transparent conductive film layer that are stacked. The first anode 1222 is prevented from affecting the display of the light transmitting region 121 through limiting the area of the light transmitting region 121 of the first anode 1222 and ensuring a density of the first pixel 122.

It should be noted that, when limiting the area of the light transmitting region 121, referring to FIG. 3 to FIG. 9, by designing an overall shape of the light transmitting region 121, the overall transmittance of the function additional region 12 can also be improved.

Figure 4:
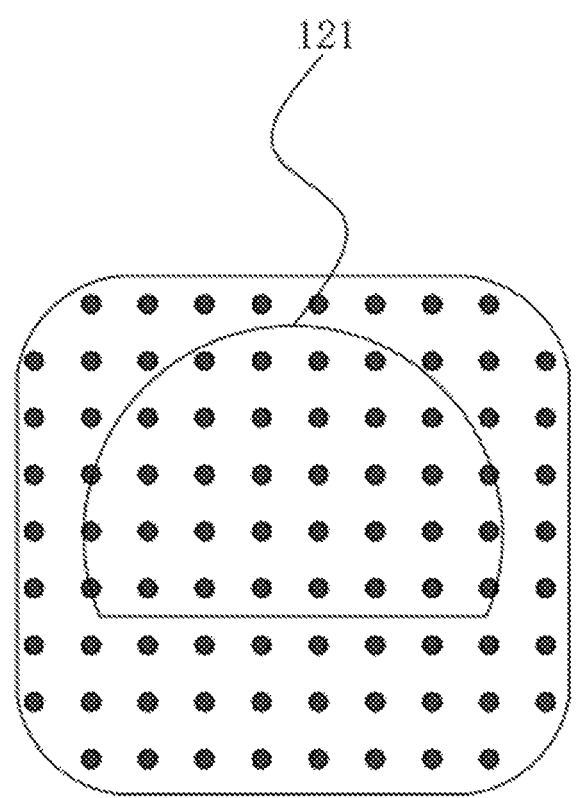
FIG. 4 is a schematic view showing the overall shape of the light transmitting region in a semicircular shape according to an embodiment of the present invention.
Figure 5:
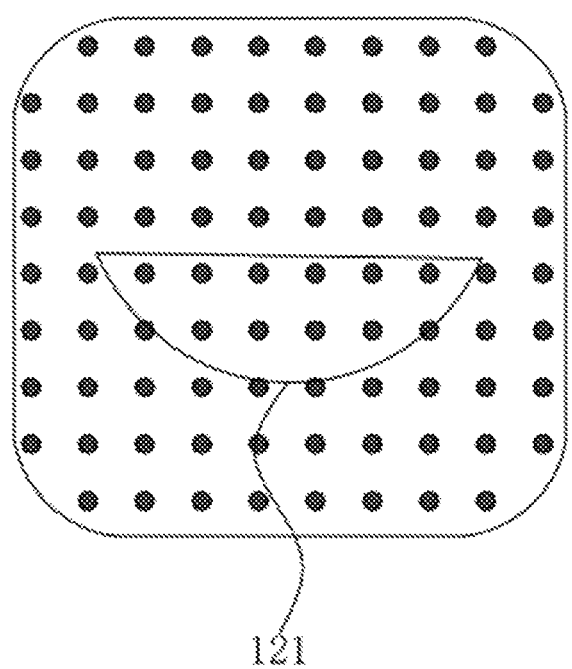
FIG. 5 is a schematic view showing the overall shape of the light transmitting region in a small semicircular shape according to an embodiment of the present invention.

In an embodiment, the overall shape of the light transmitting region 121 is circular (as shown in FIG. 3), large semicircular (as shown in FIG. 4), or small semicircular (as shown in FIG. 5). A length of a diameter of the light transmitting region 121 is 1.0 to 10 mm.

In actual implementation, the length of the diameter of the light transmitting region 121 may be 1 mm, 2 mm, 5 mm, or other values, which are not enumerated here.

Figure 6:
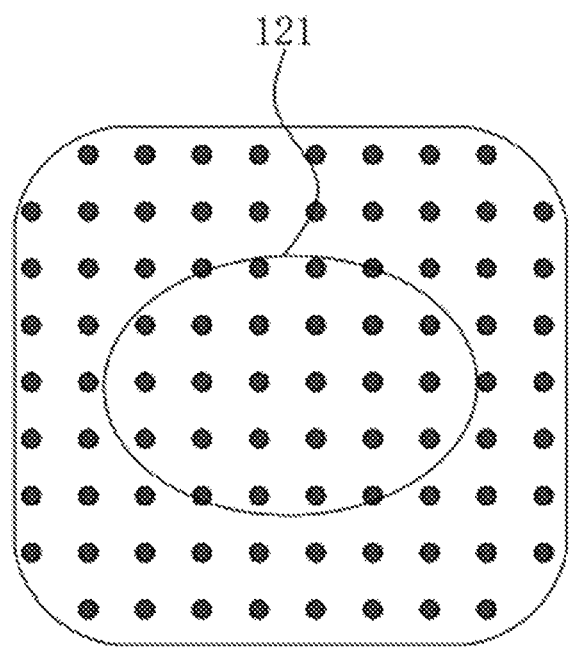
FIG. 6 is a schematic view showing the overall shape of the light transmitting region in an elliptical shape according to an embodiment of the present invention.
Figure 7:
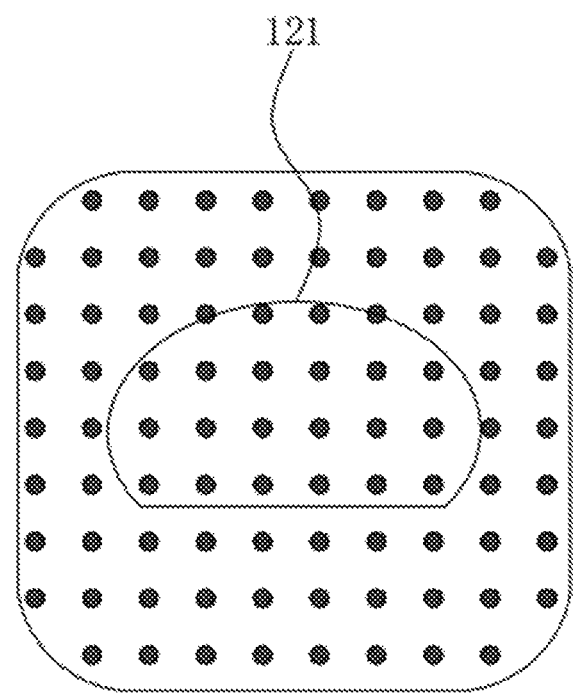
FIG. 7 is a schematic view showing the overall shape of the light transmitting region in a substantially semi-elliptical shape according to an embodiment of the present invention.

In another embodiment, the overall shape of the light transmitting region 121 is elliptical (as shown in FIG. 6), large semi-elliptical (as shown in FIG. 7), or small semi-elliptical (as shown in FIG. 8). A length of a short axis of the light transmitting region 121 is 1.0 to 10 mm, and a length of a long axis is 1.5 to 200 mm.

In actual implementation, the length of the short axis of the light transmitting region 121 may be 1 mm, 2 mm, 5 mm, or other values, which are not enumerated here. The length of the long axis can be 1.5 mm, 2 mm, 5 mm, 20 mm, 50 mm, 100 mm, which are not enumerated here.

Figure 9:
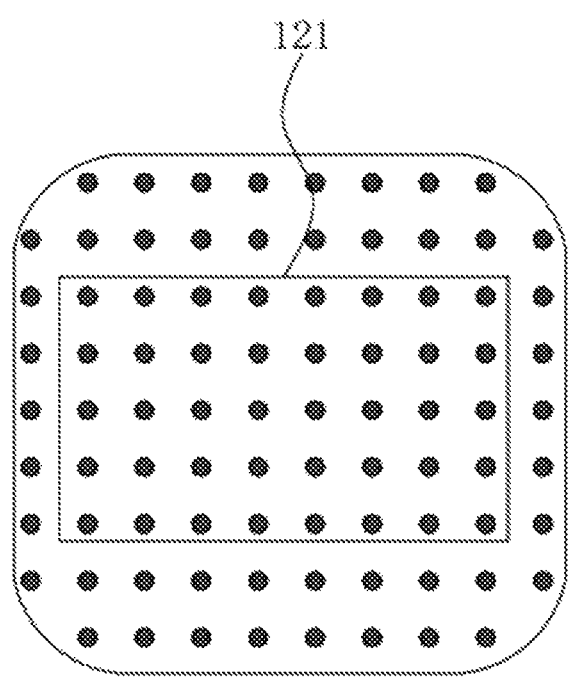
FIG. 9 is a schematic view showing the overall shape of the light transmitting region in a rectangular shape according to an embodiment of the present invention.

It should be noted that the overall shape of the light transmitting region 121 may also be a regular polygon, such as a rectangle (as shown in FIG. 9), a triangle, or a pentagon, etc. The short side of the light transmitting region 121 has a length of 1.0 to 10 mm, and the long side has a length of 1.5 to 200 mm.

It should be noted that, in actual implementation, the overall shape of the light transmitting region 121 may also be a square shape, a rounded rectangle, or an irregular polygon, which are not enumerated here.

It should be noted that in FIG. 3 to FIG. 9, only one light transmitting region 121 is disposed in the function additional region 12.

Figure 10:
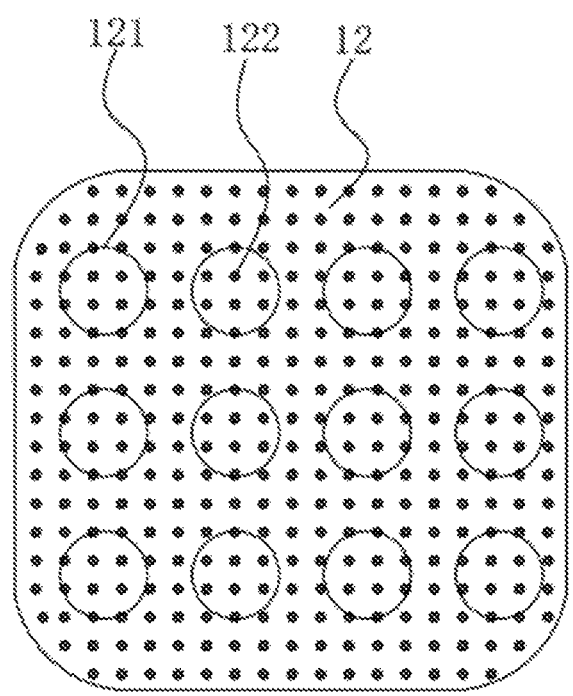
FIG. 10 is a schematic view showing a plurality of light transmitting regions in an embodiment of the present invention.

It should be noted that, in actual implementation, as shown in FIG. 10, for example, the pixel density in the function additional region 12 may be increased according to actual needs to facilitate driving the first pixel 122, and two or three or more light transmitting regions 121 may be disposed in the function additional region 12 due to factors such as limitation of process conditions.

The plurality of light transmitting regions 121 are spaced apart from each other. Each of the light transmitting regions 121 is provided with the first pixel 122. The first driving circuit 1221 and the signal line are distributed on a peripheral side of each of the light transmitting regions 121. The first driving circuit 1221 is electrically connected to the first pixel 122 for driving the first pixel 122.

Figure 11:
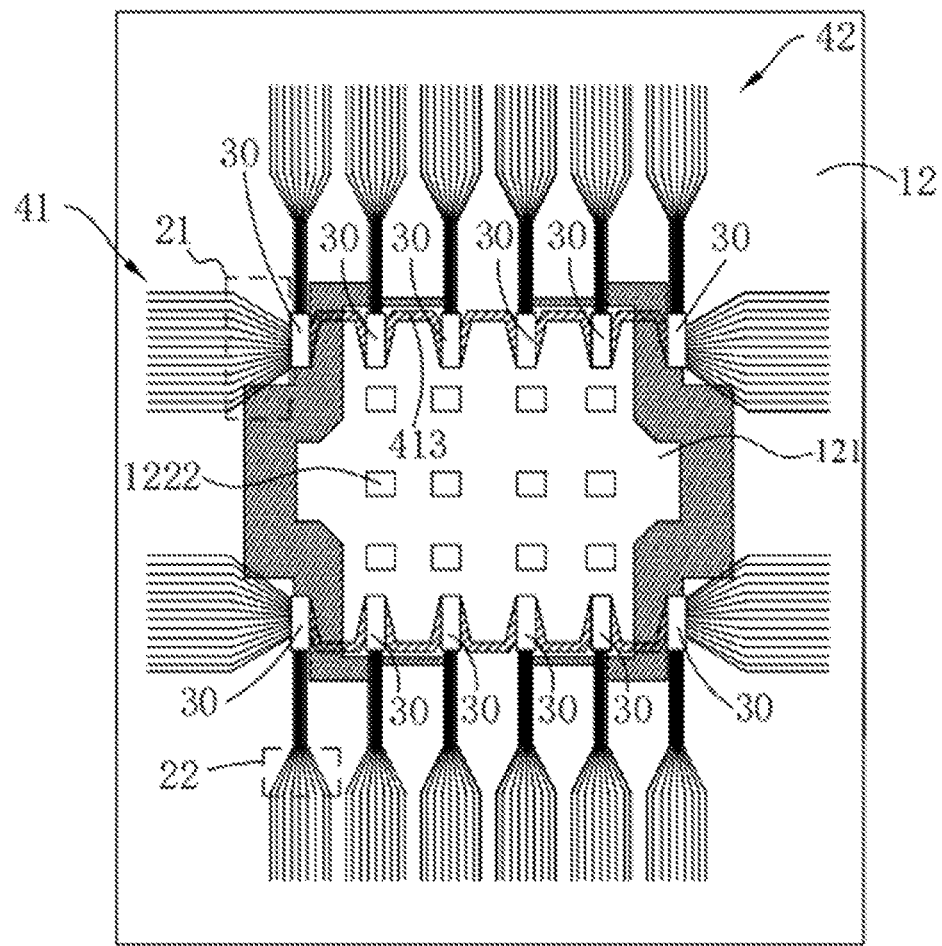
FIG. 11 and FIG. 12 are schematic views showing an arrangement of a driving circuit and a signal line according to an embodiment of the present invention.

It should be noted that the light transmitting regions 121 may be arranged in an array or randomly distributed. FIG. 11 only shows the case that all of the light transmitting regions 121 are circular in shape. In actual implementation, the shape of the light transmitting region 121 may be any of the above-listed shapes, and all of the light transmitting regions 121 may have the same shape or different shapes.

It should be noted that, when there are multiple light transmitting regions 121 in the function additional region 12, the number of the light transmitting regions 121 can be selected according to the shape and size of the function additional region 12 and the preset area of the light transmitting region 121 in the actual implementation.

It should be noted that the overall transmittance of the function additional region 12 is related to the number of the light transmitting regions 121. The greater the number of the light transmitting regions 121 is, the more the first driving circuit 1221 and the signal lines distribution in the function additional region 12 are scattered. The opaqueness of the first driving circuit 1221 and the signal line cause the transmittance to decrease. Therefore, in an embodiment, only one light transmitting region 121 may be disposed in the function additional region 12, during which the single hole area of the light transmitting region 121 is the largest, and the overall transmittance of the function additional region 12 is the highest.

Figure 12:
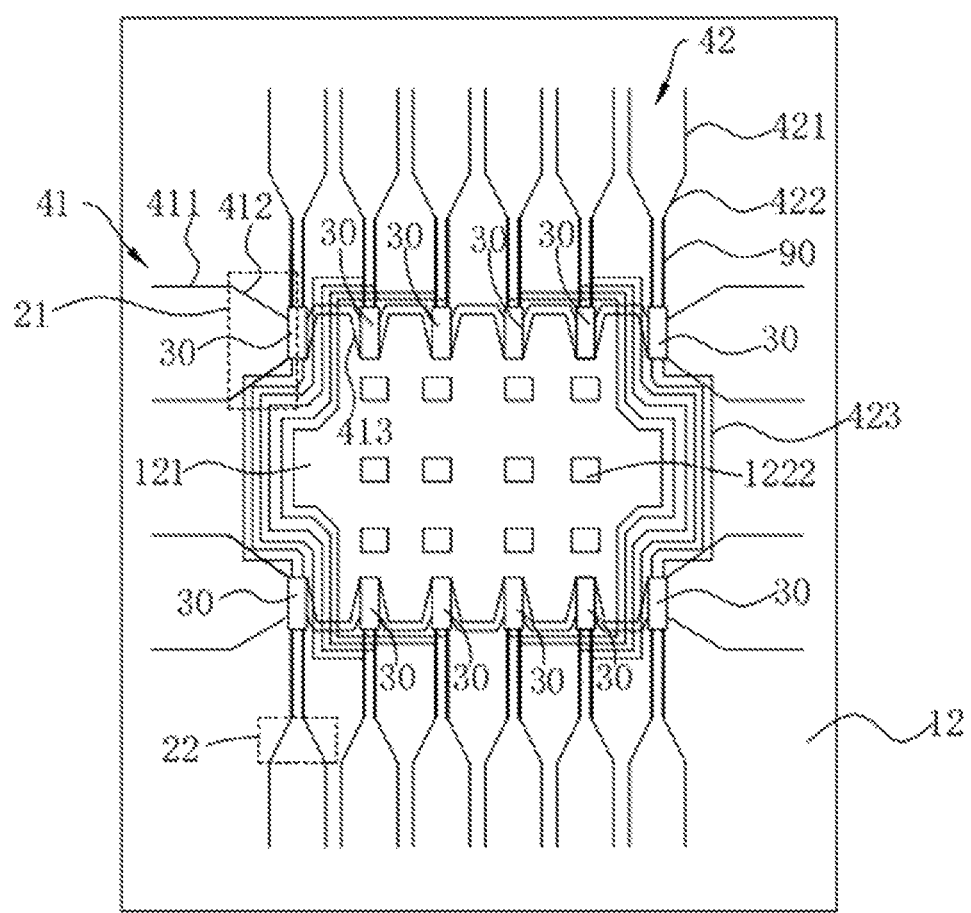

As shown in FIG. 11 and FIG. 12, the peripheral side of the light transmitting region 121 is provided with a plurality of pixel driving circuit islands 30 and signal lines formed by pixel driving circuits.

The pixel driving circuit island 30 comprises the first driving circuit 1221. The signal line is electrically connected to the first driving circuit 1221 to input various electrical signals to the pixel driving circuit island 30. The pixel driving circuit island 30 and the signal line are not disposed in the light transmitting region 121.

It should be noted that the setting of the first driving circuit 1221 needs to occupy an area of a certain region. By forming the pixel driving circuit islands 30 by relatively concentrating the first driving circuits 1221, the area size of the light transmitting region 121 can be increased. The first driving circuit 1221 and the signal line for driving the first pixel 122 are disposed on a circumferential side of the light transmitting region 121 to ensure that the pixel driving circuit island 30 is not required to be disposed in the light transmitting region 121, thereby preventing the first driving circuit 1221 and signal lines from affecting the display and light transmission of the light transmitting region 121.

It should be noted that the first anode 1222 disposed in at least a portion of the light transmitting region 121 means that the first anode 1222 is disposed in one light transmitting region 121 or disposed in the plurality of light transmitting regions 121. In an actual implementation, the first anode 1222 may also be disposed in all of the light transmitting regions 121.

It should be noted that the first driving circuit 1221 can be used to drive the plurality of first pixels 122 in the light transmitting region 121 to ensure that no driving circuit is disposed in the light transmitting region 121, so that the light transmitting region 121 has a high transmittance. The first driving circuit 1221 can also be used to drive the first pixels 122 in the area other than the light transmitting region 121 in the function additional region 12.

It should be noted that the first driving circuit 1221 and the signal lines may be disposed in the function additional region 12, or may be disposed in the main display region 11. In addition to driving the first pixel 122 in the function additional region 12, the pixel driving circuit island 30 may also be responsible for driving a portion of the second pixel 111 in the main display region 11 near the function additional region 12.

It should be noted that each of the pixel driving circuit islands 30 is formed by collectively gathering a plurality of pixel driving circuits in an island shape, and the concentrated gathering is compared with the dispersion of the pixel driving circuits in the conventional technology. That is, one pixel driving circuit corresponding to one pixel in the conventional technology. The pixel driving circuit comprises a plurality of switching elements, capacitors, signal lines, etc., and the switching elements may be thin film transistors, diodes or other devices.

Specifically, the signal lines comprise a plurality of first signal lines 41 and a plurality of second signal lines 42. The first signal lines 41 and the second signal lines 42 are electrically connected to the pixel driving circuit islands 30 to input various electrical signals to the pixel driving circuit islands 30. The pixel driving circuit island 30 is electrically connected to the first anode 1222 through a transparent wire to transmit an electrical signal to the first anode 1222.

The first signal line 41 may comprise at least one of a scan line, an illuminating signal line for controlling the illuminating of the OLED, and a reset line for controlling the anode reset of the OLED. Each of the first signal lines 41 comprises a first straight line section 411, a first bypass section 413, and a first transition section 412.

Specifically, the display panel 10 further comprises a plurality of first sector regions 21 and a plurality of second sector regions 22. The first sector region 21 is a region defined by a plurality of the first transition sections 412 in a fan-shaped arrangement, and the second sector region 22 is a region defined by a plurality of the second transition sections 422 in a fan-shaped arrangement.

Wherein, the plurality of first straight line sections 411 are horizontally arranged in parallel, the first transition section 412 is disposed in the first sector region 21, and the plurality of first transition sections 412 are fan-shaped in the first sector region 21. The first straight line section 411 extends to the first sector region 21 and is electrically connected to the first transition section 412, so that the plurality of first signal lines 41 are integrated with the plurality of sets of first signal lines 41, and thus change an extended path of the plurality of sets of first signal lines 41 to avoid the function additional region 12. A spacing between two adjacent first transition sections 412 in the first sector section 21 is less than a spacing between adjacent two first straight line sections 411. In order to prevent a short circuit between the two adjacent first transition sections 412 having less spacing, the plurality of first transition sections 412 of the first sector region 21 may be divided into at least two layers.

The first bypass section 413 is electrically connected to all of the pixel drive circuit islands 30 in the first group of the pixel driving circuit island 30 in sequence. The first bypass section 413 can be a straight line, an arc, or a plurality of polygonal sections.

Specifically, the second signal line 42 may comprise data lines. Each of the second signal lines 42 comprises a second straight line section 421, a second bypass section 423, and a second transition section 422.

Wherein, the plurality of second straight line sections 421 of the plurality of second signal lines 42 are vertically arranged in parallel. A vertical projection of the plurality of first straight line sections 411 of the plurality of first signal lines 41 on the display panel 10 and a vertical projection of the plurality of second straight line sections 421 of the plurality of second signal lines 42 on the display panel 10 intersected perpendicular to each other. The second transition section 422 is disposed in the second sector region 22, and the plurality of second transition sections 422 are fan-shaped in the second sector region 22. The second straight line section 421 extends to the second sector region 22 and is electrically connected to the second transition section 422, so that the plurality of second signal lines 42 are integrated with the plurality of sets of second signal lines 42, and thus change an extended path of the plurality of sets of second signal lines 42 to avoid the function additional region 12. A spacing between adjacent two second transition sections 422 in the second sector region 22 is less than a spacing between adjacent two second straight line sections 421.

The plurality of second straight line sections 421 of the plurality of second signal lines 42 are divided into a plurality of clusters respectively extending to the plurality of second sector regions 22 to be electrically connected to the plurality of second transition sections 422. Each cluster of the first straight line section 411 correspondingly extends into the second sector region 22. The plurality of second transition sections 422 are divided into a plurality of clusters, and each cluster of second transition sections 422 is disposed in the same second sector region 22. The plurality of second sector regions 22 are symmetrically disposed on opposite sides of the function additional region 12 and disposed adjacent to the first bypass line. The second bypass section 423 of the plurality of second signal lines 42 is disposed at the edge of the function addition region 12. The second transition section 422 is electrically connected to the second bypass section 423 one-to-one. The first bypass section 413 and the second bypass section 423 are disposed at different layers.

The two ends of the second bypass section 423 are electrically connected to the second transition section 422. That is, the second bypass section 423 is electrically connected to the second transition section 422.

It should be noted that a plurality of the first bypass sections 413, a plurality of the second bypass sections 423, and at least a portion of the pixel driving circuit islands 30 are formed as the light transmitting region 121.

Further, the light transmitting region 121 is convex or concave corresponding to an edge of the first group of pixel driving circuit islands 30 at the edge of the first bypass section 413 to increase a light transmissive area of the function additional region 12.

As shown in FIG. 12, the display panel 10 further comprises a plurality of connecting lines 90. The connecting line 90 and the second bypass section 423 are disposed in different layers, and each set of the second bypass section 423 comprises at least two second bypass sections 423 having different lengths. The two ends of the second bypass section 423 of each cluster are respectively electrically connected to the pixel driving circuit islands 30 of the first group of pixel driving circuit islands 30 which are mutually mirrored by the connecting line 90, so as to prevent the same group of two adjacent clusters of second bypass sections 423 from experiencing short circuits during the extension process in order to achieve electrical connection with the pixel driving circuit islands 30.

Figure 13:
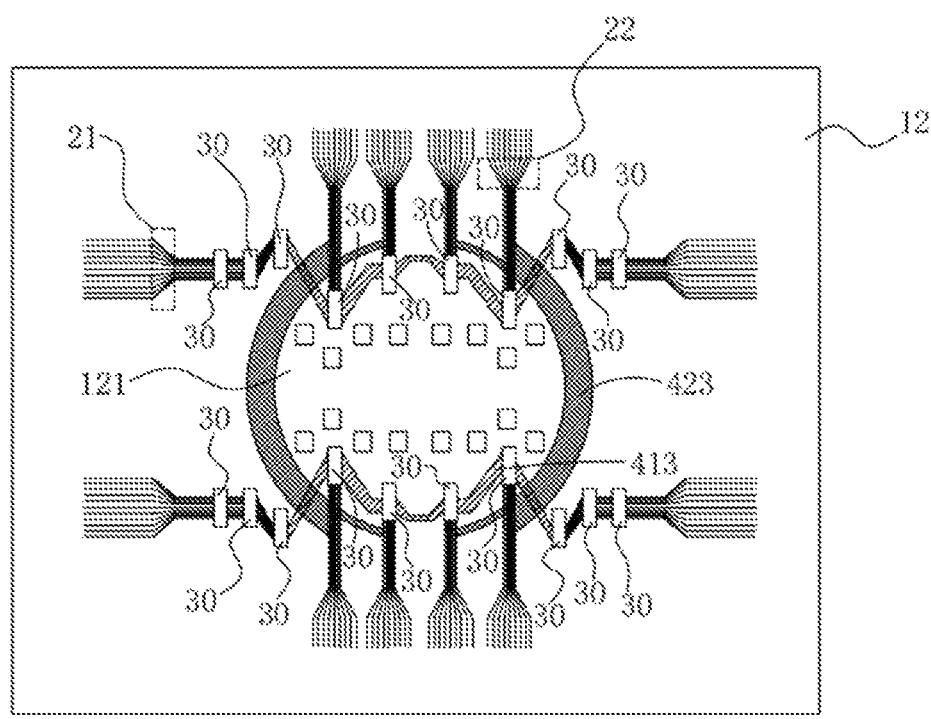
FIG. 13 and FIG. 14 are schematic views showing an arrangement of a driving circuit and a signal line according to another embodiment of the present invention.
Figure 14:
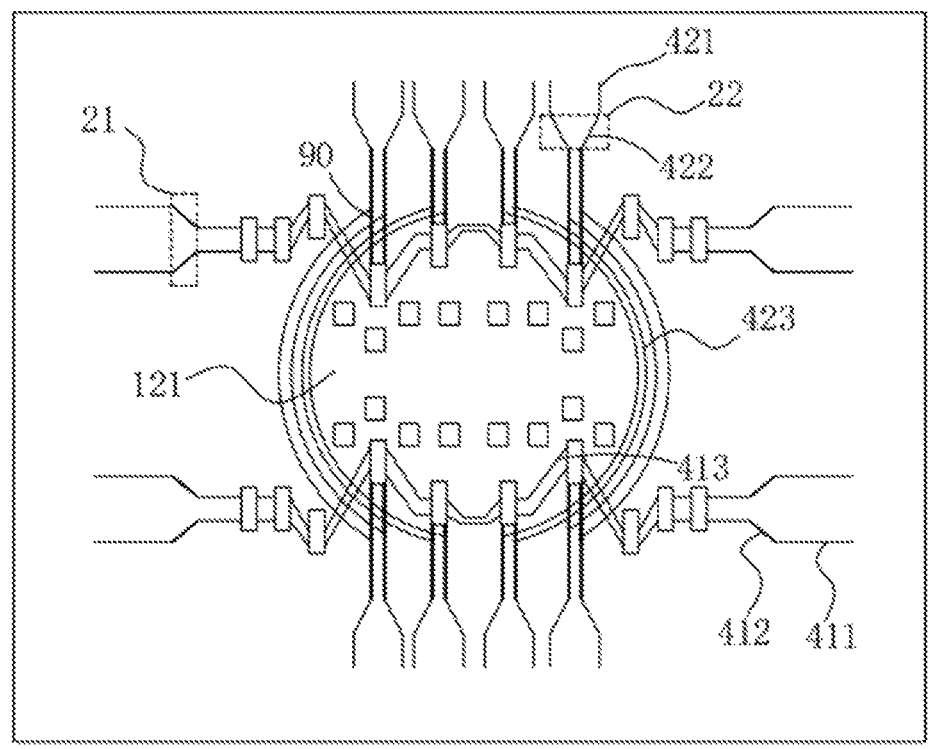

As shown in FIG. 13 and FIG. 14, the display panel 10 shown in FIG. 13 is basically similar in structure to the display panel 10 shown in FIG. 11, except that the second bypass section 423 of the second signal line 42 is arranged in an arc.

Specifically, the second bypass section 423 of the second signal line 42 is disposed in a circular arc line, and the overall shape of the light transmitting region 121 is circular. The second bypass section 423 of the second signal line 42 is disposed in an elliptical arc, and the overall shape of the light transmitting region 121 is elliptical.

Figure 15:
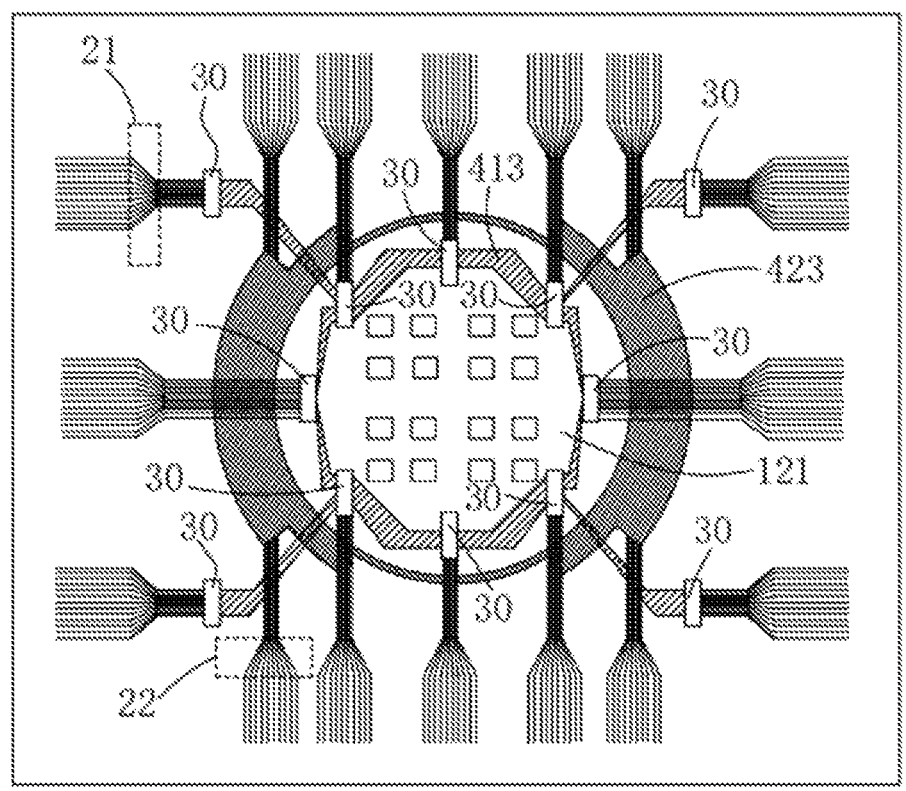
FIG. 15 and FIG. 16 are schematic views showing an arrangement of a driving circuit and a signal line according to yet another embodiment of the present invention.
Figure 16:
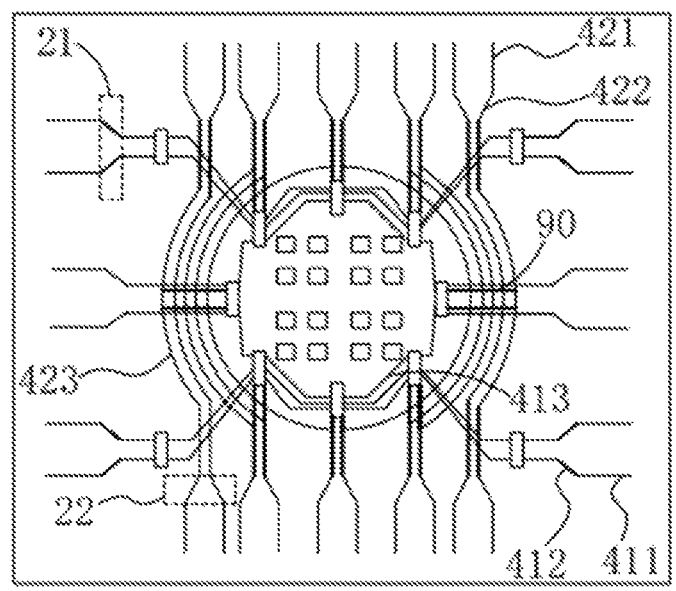

As shown in FIG. 15 and FIG. 16, the display panel 10 shown in FIG. 15 is substantially similar in structure to the display panel 10 shown in FIG. 11, except that at least a portion of the second bypass section 423 of the second signal line 42 is disposed around the entire light transmitting region 121.

A portion of the pixel driving circuit islands 30 are uniformly arranged in a ring shape at the edge of the light transmitting region 121. The second bypass sections 423 of the plurality of second signal lines 42 are disposed around the light transmitting region 121 and are electrically connected to at least a portion of the pixel driving circuit islands 30. The first bypass sections 413 of the plurality of first signal lines 41 are electrically connected to any two adjacent pixel driving circuit islands 30 of the pixel driving circuit islands 30 in sequence.

In the conventional technology, a pixel driving circuit is disposed under each of the display sub-pixels, so that the plurality of pixel driving circuits corresponding to the plurality of display pixels are distributedly distributed. By providing a plurality of pixel drive circuit islands 30 formed by the pixel drive circuits in a relatively concentrated manner on the periphery of the light transmitting region 121, the first driving circuit 1211 in the pixel driving circuit island 30 is used to drive the plurality of first pixels 122 in the light transmitting region 121 so that no pixel driving circuit is provided in the light transmitting region 121, thereby improving the transmittance of the light transmitting region 121. The arrangement of the plurality of pixel driving circuit islands 30 also increases the size of the light transmitting region 121. The plurality of first signal lines 41 and the plurality of second signal lines 42 are disposed on the periphery of the light transmitting region 121 in cooperation with the plurality of pixel driving circuit islands 30 to further improve the transmittance of the light transmitting region 121.

The beneficial effects of the invention are: by properly setting the shapes and the areas of the light transmitting region 121, and limiting the area of the first anode 1222 disposed in the light transmitting region 121, the overall transmittance of the functional additional region 12 is improved. The function additional region 12 can be used for displaying the images, so that the display panel 10 can display the effect of the full-screen display, and can also be used for installing the photosensitive elements such as the camera to improve the user experience.

In the above, various other corresponding changes and modifications can be made according to the technical solutions and technical ideas of the present invention to those skilled in the art, and all such changes and modifications are within the scope of the claims of the present invention.

What is claimed is:

1. A display device, comprising:
a display panel, wherein the display panel comprises a main display region and a function additional region, and at least a portion of the function additional region is surrounded by the main display region;
wherein a plurality of first pixels are arranged in the function additional region, at least one light transmitting region is disposed in the function additional region, and an area of each of the at least one light transmitting region is greater than or equal to 0.32 square millimeters ($mm^2$); and
wherein an overall shape of the at least one light transmitting region is circular, large semicircular, or small semicircular, and a length of a diameter of the at least one light transmitting region is 1.0 to 10 mm, or the overall shape of the at least one light transmitting region is a regular polygon, a short side of the at least one light transmitting region has a length of 1.0 to 10 mm, and a long side of the at least one light transmitting region has a length of 1.5 to 200 mm.

2. The display device as claimed in claim 1, wherein the area of each of the at least one light transmitting region is less than or equal to 120 $mm^2$.

3. The display device as claimed in claim 2, wherein the area of each of the at least one light transmitting region is 0.36 to 100 $mm^2$.

4. The display device as claimed in claim 1, wherein a first anode for driving the first pixels is provided in at least one of the light transmitting region, and a sum of areas of all of the first anodes disposed in the at least one light transmitting region is less than or equal to 50% of the area of the corresponding at least one light transmitting region.

5. The display device as claimed in claim 4, wherein the sum of the areas of all of the first anodes disposed in the at least one light transmitting region is greater than or equal to 5% of the area of the corresponding at least one light transmitting region.

6. The display device as claimed in claim 4, further comprising a substrate and a plurality of first driving circuits disposed on the substrate, and the first driving circuits disposed at a periphery of the at least one light transmitting region.

7. The display device as claimed in claim 6, wherein the display panel further comprises at least two insulating layers disposed on the substrate, the first driving circuits are disposed on the substrate and covered by the insulating layers, and the first driving circuits and the first anode are electrically connected through a transparent wire disposed in at least two of the insulating layers.

8. The display device as claimed in claim 7, wherein a plurality of second pixels are disposed in the main display region, a second driving circuit disposed in the main display region is disposed on the substrate, and the second pixels are electrically connected to the second driving circuit through a conductive layer disposed in the at least two of the insulating layers.

9. The display device as claimed in claim 8, wherein the area of each of the at least one light transmitting region is greater than or equal to 50 times an area of each of the second pixels, and the area of each of the at least one light transmitting region is less than or equal to 210,000 times the area of each of the second pixels.

10. A display device, comprising:
a display panel, wherein the display panel comprises a main display region and a function additional region, and at least a portion of the function additional region is surrounded by the main display region;
wherein a plurality of first pixels are arranged in the function additional region, at least one light transmitting region is disposed in the function additional region, and an area of each of the at least one light transmitting region is greater than or equal to 0.32 square millimeters ($mm^2$).

11. The display device as claimed in claim 10, wherein the area of each of the at least one light transmitting region is less than or equal to 120 $mm^2$.

12. The display device as claimed in claim 11, wherein the area of each of the at least one light transmitting region is 0.36 to 100 $mm^2$.

13. The display device as claimed in claim 10, wherein a first anode for driving the first pixels is provided in at least one of the light transmitting region, and a sum of areas of all of the first anodes disposed in the at least one light transmitting region is less than or equal to 50% of the area of the corresponding at least one light transmitting region.

14. The display device as claimed in claim 13, wherein the sum of the areas of all of the first anodes disposed in the at least one light transmitting region is greater than or equal to 5% of the area of the corresponding at least one light transmitting region.

15. The display device as claimed in claim 13, further comprising a substrate and a plurality of first driving circuits disposed on the substrate, and the first driving circuits disposed at a periphery of the at least one light transmitting region.

16. The display device as claimed in claim 15, wherein the display panel further comprises at least two insulating layers disposed on the substrate, the first driving circuits are disposed on the substrate and covered by the insulating layers, and the first driving circuits and the first anode are electrically connected through a transparent wire disposed in at least two of the insulating layers.

17. The display device as claimed in claim 16, wherein a plurality of second pixels are disposed in the main display region, a second driving circuit disposed in the main display region is disposed on the substrate, and the second pixels are electrically connected to the second driving circuit through a conductive layer disposed in the at least two of the insulating layers.

18. The display device as claimed in claim 17, wherein the area of each of the at least one light transmitting region is greater than or equal to 50 times an area of each of the second pixels, and the area of each of the at least one light transmitting region is less than or equal to 210,000 times the area of each of the second pixels.

19. The display device as claimed in claim 10, wherein an overall shape of the at least one light transmitting region is circular, large semicircular, or small semicircular, and a length of a diameter of the at least one light transmitting region is 1.0 to 10 mm.

20. The display device as claimed in claim 10, wherein an overall shape of the at least one light transmitting region is a regular polygon, a short side of the at least one light transmitting region has a length of 1.0 to 10 mm, and a long side of the at least one light transmitting region has a length of 1.5 to 200 mm.

* * * * *